United States Patent [19]

Teraishi et al.

[11] 3,909,638

[45] Sept. 30, 1975

[54] VARIABLE CERAMIC CAPACITOR FOR AN ELECTRONIC WRISTWATCH

[75] Inventors: Katsuhiro Teraishi; Kuniharu Yamada, both of Suwa, Japan

[73] Assignee: Kabushiki Kaisha Suwa Seikosha, Tokyo, Japan

[22] Filed: June 5, 1974

[21] Appl. No.: 476,642

[30] Foreign Application Priority Data

June 5, 1973 Japan .................. 48-63124

[52] U.S. Cl. .................. 310/8.1; 310/8.9; 317/248; 317/258; 252/63.2; 252/63.5; 58/23 A

[51] Int. Cl.[2] .................. H01L 41/08

[58] Field of Search .................. 310/8.1, 8.2, 8.9; 106/39.8, DIG. 5; 317/248, 258, 259; 252/63.2, 63.5; 58/23 A, 23 AC

[56] References Cited

UNITED STATES PATENTS

| | | | |
|---|---|---|---|
| 3,231,328 | 1/1966 | Pechini | 252/63.5 |
| 3,231,799 | 1/1966 | Prokopowicz | 252/63.2 X |
| 3,289,055 | 11/1966 | Aizawa et al. | 317/248 |
| 3,529,978 | 9/1970 | Taylor et al. | 252/63.5 X |
| 3,728,641 | 4/1973 | Fujita et al. | 317/258 X |
| 3,737,746 | 6/1973 | Cielaszyk et al. | 53/23 AC |
| 3,737,805 | 6/1973 | Shimodaira | 317/258 X |

*Primary Examiner*—Mark O. Budd

*Attorney, Agent, or Firm*—Blum, Moscovitz, Friedman & Kaplan

[57] ABSTRACT

An electronic wristwatch of the type including a piezoelectric oscillator as the standard source and a compensator circuit for correcting the frequency thereof including capacitance adjustment means is provided with a ceramic variable capacitor in the compensator circuit wherein the ceramic has a permittivity of about 200 to about 1,000 and the effect of temperature on the capacitance thereof is ± 1,000 ppm/°C.

9 Claims, 4 Drawing Figures

VARIABLE CERAMIC CAPACITOR FOR AN ELECTRONIC WRISTWATCH

BACKGROUND OF THE INVENTION

This invention relates to an electronic wristwatch of the type wherein a ceramic capacitor is employed for compensating for frequency variances in the piezoelectric oscillator thereof.

Conventional variable ceramic capacitors are generally unsuited for use in an electronic wristwatch because of their generally small capacity per unit volume and their concomitantly narrow variable capacity range relative to a suitable size thereof which may be mounted in a compact electronic wristwatch. Therefore, their abiity to compensate for significant frequency variations in the frequency emitted by standard piezoelectric oscillators of the type employed in electronic wristwatches is generally unsatisfactory.

Accordingly, the instant invention provides a variable ceramic capacitor with substantial capacity per unit volume thereof. The capacity per unit volume ratio of the capacitor is substantially increased by preselecting the materials of which the capacitor is fabricated according to the permittivity thereof. Optimal variable capacitance is thereby achieved with minimal volume. Significantly, the effect of temperature on the capacitance thereof is in the range of ± 1,000 ppm/°C.

SUMMARY OF THE INVENTION

Generally speaking, in accordance with the invention, an electronic wristwatch of the type including a piezoelectric oscillator as the standard source and an oscillating circuit including compensator means for correcting the frequency thereof including capacitance adjustment means is provided with a ceramic variable capacitor in the compensator circuit comprising a ceramic having a permittivity of about 200 to about 1,000 and wherein the effect of temperature on the capacitance thereof is in the range of ± 1,000 ppm/°C.

Accordingly, it is an object of the instant invention to provide a ceramic variable capacitor operatively connected in the compensator circuit of an electronic wristwatch which is characterized by a substantial capacity per unit volume thereof and which is suitable for substantial frequency adjustments with suitable accuracy.

Another object of the invention is to provide a variable capacitor for the compensator circuit of an electronic wristwatch which improves the efficiency thereof.

A further object of the invention is to provide a ceramic variable capacitor of the type which may be employed in the frequency compensator circuit of an electronic wristwatch wherein capacitance is only minimally effected by temperature variations.

Still other objects and advantages of the invention will in part be obvious and will in part be apparent from the specification.

The invention accordingly comprises the several steps and the relation of one or more of such steps with respect to each of the others, the apparatus embodying features of construction, combinations and arrangement of parts which are adapted to effect such steps, and the product which possesses the characteristics, properties, and relation of constituents, all as exemplified in the detailed disclosure hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENT

Conventional starting materials of suitable purity, and preferably at least 99% pure (4N), may be employed in the fabrication of capacitors within the scope of the invention. Suitable ceramic starting materials include, for instance, carbonates of Group I and Group II elements and oxides of Group IV and Group V elements. Preferred ceramic starting materials within these respective groups include $BaCO_3$, $Na_2CO_3$, $SrCO_3$, $LiCO_3$, $BaTiO_3$, $Pb_3O_4$ and $Nb_2O_5$. The suitable starting materials are preferably employed as fine powders and most preferably the average particle size thereof is less than 2 microns. A preferred ceramic composition comprises an admixture of 80-95% $BaTiO_3$ and 5–20% $BaCO_3$, $Na_2CO_3$, and $Nb_2O_5$. A particularly preferred form of this composition includes 90 mols of $BaTiO_3$ and 10 mols of admixed $BaCO_3$, $Na_2CO_3$ and $Nb_2O_5$. In the most preferred admixture of $BaCO_3$, $Na_2CO_3$ and $Nb_2O_5$ the atomic ratio of Na and Nb to Ba is 1:3:4.

In the fabrication of the capacitor from the starting material, a suitable powder admixture of starting materials is milled in a wet grinder for about 24 hours under constant agitation. The wet fines are dried and calcined at about 1200°C at ambient pressure for about 6 hours. The calcined fines are milled in a wet grinder for another 48 hours under constant agitation. To these wet fines a PVA binder is added under agitation and the bound fines are pressed and formed into a wafer. The wafer preferably has a diameter of 3.6 millimeters and a thickness of about 0.9 millimeters and includes an axial aperture in the center thereof of about 1.08 millimeters diameter. The formed wafer is thereafter sintered at about 1500°C at ambient pressure for about 3 hours and is provided with a suitably printed electrode, for instance of silver, at about 700°C.

The circular sintered wafer comprises a rotor having suitable chemical and physical characteristics for the variable capacitor of the invention. In combination therewith, a suitable alumina ceramic stator provided with a plated silver electrode may be employed. The rotor and stator may be suitable assembled, for instance by means of a rotor shaft and biasing means to provide a variable porcelain capacitor within the scope of the invention.

Figure 1A:
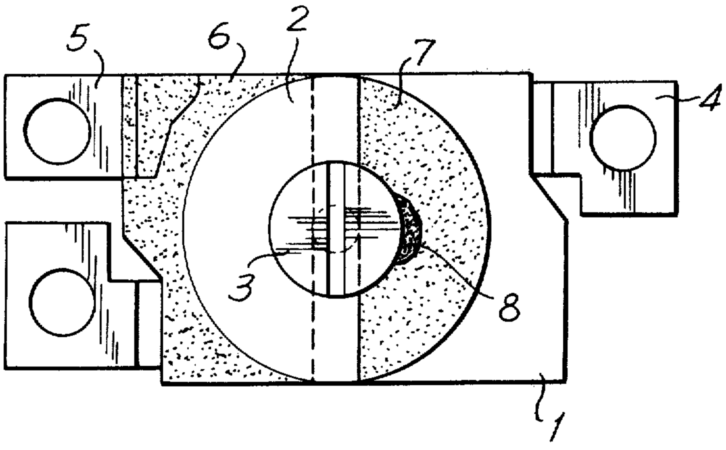
FIG. 1*a* is a plan view of a ceramic capacitor constructed in accordance with the present invention.
Figure 1B:
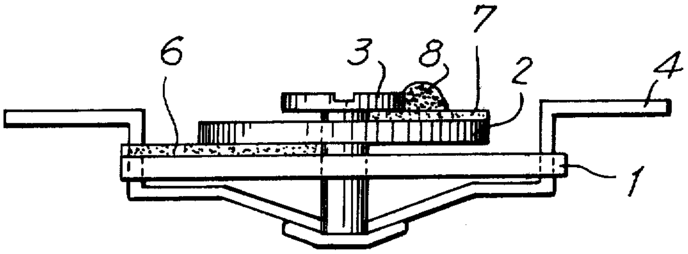
FIG. 1*b* is a sectional elevational view of the embodiment illustrated in FIG. 1*a;*

Referring now to FIGS. 1*a* and 1*b*, a stator 1 and a rotor 2 are mounted on a rotor shaft 3 and secured in position thereon by a biasing means 4, for instance a hold spring. A stator electrode 6 is provided on stator 1 and connected thereto is a lead terminal 5. Mounted on rotor 2 is an electrode 7 provided with a conductively connected solder mass 8 oscillatable between rotor shaft 3 and biasing means 4.

The capacitance between terminals 4 and 5 of the embodiment ranges between about 5 pico farads and about 45 pico farads. The variable capacitance of the embodiment is much broader than the range of capacitance of conventional capacitors which may be employed in a wristwatch. The temperature dependence of the capacitor is substantially minimal. In a preferred capacitor embodiment wherein the rotor is fabricated of $BaTiO_3$, $BaCO_3$, $Na_2CO_3$, and $Nb_2O_5$ admixed in the particularly preferred proportions as hereinbefore set forth and prepared and sintered in the manner described, while otherwise being assembled with the stator as shown and described in connection with FIGS. 1*a* and 1*b*, the capacitance thereof varied to about −350 ppm/°C at 30 pico farads for a temperature range of about 0° to about 50°C and the permittivity of the sintered ceramic was about 560.

Figure 2:
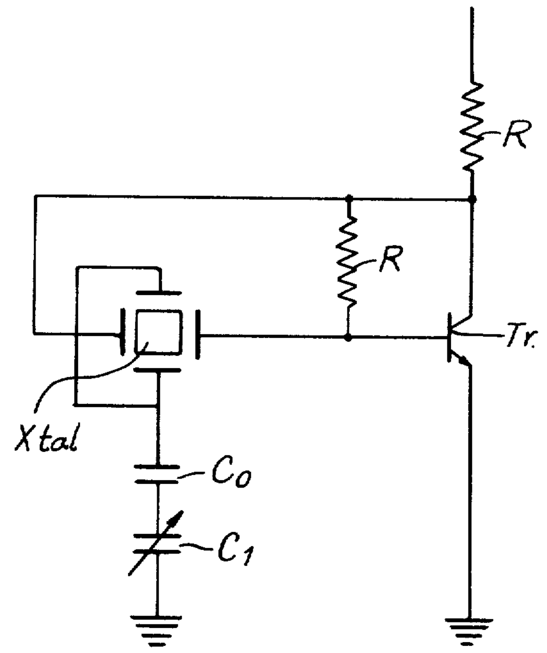
FIG. 2 is a circuit diagram of an oscillating circuit for an electronic timepiece of the type in which a ceramic capacitor of the type constructed in accordance with the instant invention may be operatively connected.
Figure 3:
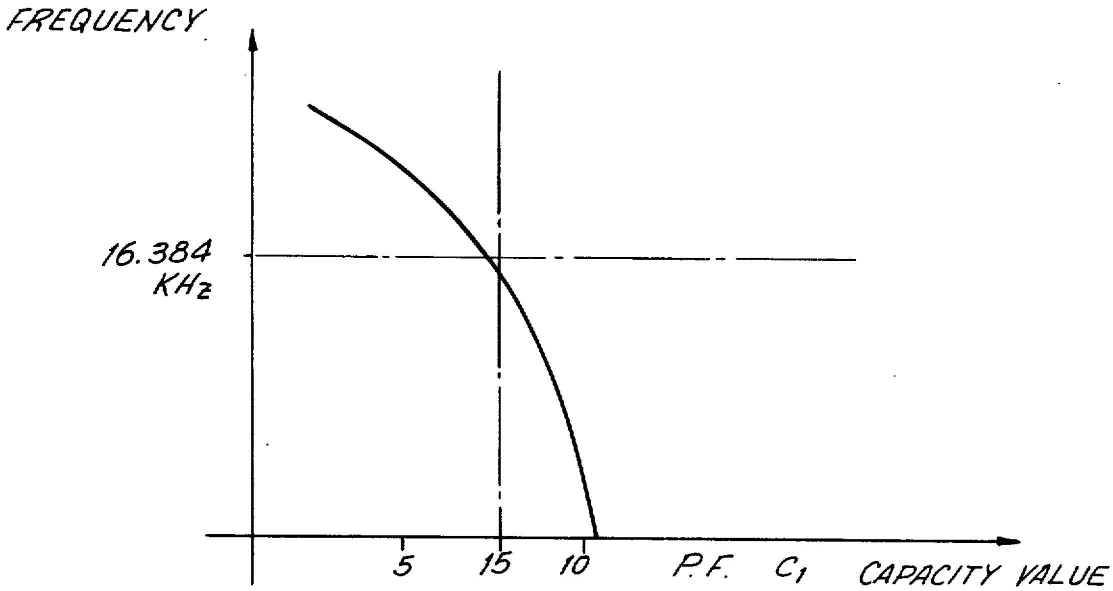
FIG. 3 is a typical graph which shows the frequency adjustment relative to the capacitance of a ceramic variable capacitor constructed in accordance with the instant invention.

The fabricated ceramic variable capacitor is operatively connected in the compensator circuit portion of the oscillating circuit of an electronic wristwatch provided for instance with a quartz crystal oscillator for thereby enabling adjustments to the frequency variations therein. The oscillating circuit may, for instance, be of the type shown in FIG. 2 wherein the variable ceramic capacitor $C_1$ is operatively connected in series to a quartz crystal oscillator generally designated as Xtal. In series therewith, is a fixed capacitor $C_O$ for compensating for temperature variations in the quartz crystal oscillator. The quartz crystal oscillator may be of the tuning fork type cut in X-5°characterized by a refractional oscillation mode and a 16 khz frequency.

Once connected in the oscillating circuit, the capacitance of the variable ceramic capacitor is suitably adjusted. If the capacitance thereof is adjusted to lower than required the wristwatch will gain time. On the other hand, if the capacitance is adjusted to larger than required, the wristwatch will lose time. With the variable ceramic capacitor of the instant invention, the adjustment to capacitance may be quickly and easily made. Since the capacitance of the variable ceramic capacitor within the scope of the invention is negligibly effected by temperature variations in the oscillator, the corrective effect thereon of capacitor $C_O$, utilized to compensate for temperature variations, is concomitantly negligible.

The following examples are set forth for illustrative purposes only, and the scope of the invention is defined in the claims. In each of the examples, the variable capacitor comprises the combinations of elements and arrangement of parts as illustrated in FIG. 1. The following examples are representative of ceramic compositions which may be processed and dimensioned in the manner set forth above for achieving a satisfactory capacitor within the scope of the invention.

EXAMPLE I

A ceramic rotor was fabricated from an admixture of $BaTiO_3$, $BaCO_3$, $Na_2CO_3$, and $Nb_2O_5$. The composition comprised 95 mols of $BaTiO_3$ and 5 mols of admixed $BaCO_3$, $Na_2CO_3$ and $NB_2O_5$. In the admixture of $BaCO_3$, $Na_2CO_3$ and $NB_2O_5$, the atomic ratio of Na and Nb to Ba is 1:3:4.

The permittivity of the sintered wafer fabricated therefrom was about 800 and the range of capacitance therefor was from about 5 pico farads to about 35 pico farads with a temperature differential of about −100 ppm/°C between about −10°C and 50°C.

A ceramic capacitor assembled utilizing this rotor provided satisfactory performance as compared with the preferred capacitor embodiment discussed hereinbefore.

EXAMPLE II

A ceramic rotor was fabricated from an admixture of $BaTiO_3$, $BaCO_3$, $Na_2CO_3$, and $NB_2O_5$. The composition comprised 80 mols of $BaTiO_3$ and 20 mols of admixed $BaCO_3$, $Na_2CO_3$ and $Nb_2O_5$. In the admixture of $BaCO_3$, $Na_2CO_3$ and $Nb_2O_5$, the atomic ratio of Na and Nb to Ba is 1:3:4.

The permittivity of the sintered wafer fabricated therefrom was about 300 and the range of capacitance therefor was from about 5 pico farads to about 40 pico farads with a temperature differential of about −320 ppm/°C between about −10°C and 50°C.

A ceramic capacitor assembled utilizing this rotor provided satisfactory performance as compared with the preferred capacitor embodiment discussed hereinbefore.

EXAMPLE III

A ceramic rotor was fabricated from an admixture of $BaTiO_3$, $SrCO_3$, $LiCO_3$, and $Nb_2O_5$. The composition comprised 80 mols of $BaTiO_3$ and 20 mols of admixed $SrCO_3$, $LiCO_3$ and $Nb_2O_5$. In the admixture of $SrCO_3$, $LiCO_3$ and $Nb_2O_5$, the atomic ratio of Li and Nb to Sr is 1:3:4.

The permittivity of the sintered wafer fabricated therefrom was about 750 and the capacitance thereof varied to about −350 ppm/°C at temperatures from about −10°C to about 50°C.

A ceramic capacitor assembled using this rotor provided satisfactory but less than optimal performance as compared with the preferred capacitor embodiment discussed hereinbefore.

EXAMPLE IV

A ceramic rotor was fabricated from an admixture of $BaTiO_3$, $SrCO_3$, $LiCO_3$, and $Nb_2O_5$. The composition comprised 97 mols of $BaTiO_3$ and 3 mols of admixed $SrCO_3$, $LiCO_3$ and $Nb_2O_5$. In the admixture of $SrCO_3$, $LiCO_3$, and $Nb_2O_5$, the atomic ratio of Li and Nb to Sr is 1:3:4.

The permittivity of the sintered wafer fabricated therefrom was about 1500 and the capacitance thereof varied ± 20 ppm/°C over a broad temperature range.

A ceramic capacitor assembled utilizing this rotor provided unsatisfactory performance as compared with the preferred capacitor embodiment discussed hereinbefore.

EXAMPLE V

A ceramic rotor was fabricated from an admixture of $BaTiO_3$, $Na_2CO_3$, $Nb_2O_5$ and $Pb_3O_4$. The molecular ratio of components was as follows:

$Ba(Na^{1/4}Nb3/4)O_3/Pb(Na^{1/4}Nb3/4)O_3 = 80/20$.

The permittivity of the sintered wafer fabricated therefrom was about 350 and the range of capacitance therefor was from about 6 pico farads to about 45 pico farads with a temperature differential of about −300 ppm/°C over a broad temperature range.

A ceramic capacitor assembled utilizing this rotor provided satisfactory performance as compared with the preferred capacitor embodiment discussed hereinbefore.

The preferred capacitor embodiment was operatively connected in the oscillating circuit of a leaf type crystal oscillator having dimensions of 7 × 0.5 × 0.05 mm. The crystal included an NT cut refractionary oscillating mode and a frequency of 32 KHZ. The capacitor satisfactorily adjusted the frequency of the oscillator over a range of from about 3 pico farads to about 15 pico farads. This frequency adjustment was performed by particular attention to the makeup of the capacitor rotor, without additional undue attention to the particular type of capacitor utilized. The capacitor was easily adjusted, of compact form and easily employed in an electronic wristwatch.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be undertood that the following claims are intended to cover all of the generic and specific features of the invention herein described, and all statements of the scope of the invention which, as a matter of language, might be said to fall therebetween.

What is claimed is:

1. A variable ceramic capacitor for adjusting frequency variations in a piezoelectric oscillator of an electronic wristwatch of the type including a piezoelectric oscillator as a standard source therefor and an oscillator circuit operatively connected thereto of the type including compensator means for compensating for frequency variations in said oscillator, said variable ceramic capacitor comprising a ceramic having a permittivity of about 200 to about 1,000 and wherein the effect of temperature on the capacitance thereof is in the range of ± 1,000 ppm/°C for the operative range of said wristwatch, said variable ceramic capacitor being operatively connected in said oscillator circuit for thereby compensating for frequency variations in said oscillator, said ceramic composition comprising a major proportion of $BaTiO_3$ and a minor proportion of carbonates of Group I and Group II elements and oxides of Group IV and Group V elements.

2. The variable ceramic capacitor as claimed in claim 1, wherein said carbonates are selected from the group consisting of $BaCO_3$, $Na_2CO_3$, $SrCO_3$ and $LiCO_3$, including mixtures thereof.

3. The variable ceramic capacitor as claimed in claim 1, wherein said oxides are $Pb_3O_4$, $Nb_2O_5$ or mixtures thereof.

4. The variable ceramic capacitor as claimed in claim 1, wherein said ceramic comprises a sintered admixture including 80–95% $BaTiO_3$ and 5–20% $BaCO_3$, $Na_2CO_3$ and $Nb_2O_5$.

5. The variable ceramic capacitor as claimed in claim 4, wherein said 5–20% of $BaCO_3$, $Na_2CO_3$ and $Nb_2O_5$ comprises adjusted proportions so as to provide an atomic ratio of Na and Nb to Ba of 1:3:4.

6. The variable ceramic capacitor as claimed in claim 1, wherein said capacitor has a capacitance of about 5 to about 45 pico farads.

7. The variable ceramic capacitor as claimed in claim 1, including a sintered ceramic wafer rotor comprising a major proportion of $BaTiO_3$ and a minor proportion of carbonates of Group I and Group II elements and oxides of Group IV and Group V elements.

8. The variable ceramic capacitor as claimed in claim 1, wherein the variance in capacitance of ± 1,000 ppm/°C occurs over a temperature range of from about −10°C to about 50°C.

9. The variable ceramic capacitor as claimed in claim 1, wherein said capacitor is operatively connected in series to said piezoelectric oscillator.

* * * * *